(12) United States Patent
Kang

(10) Patent No.: US 7,173,843 B2
(45) Date of Patent: Feb. 6, 2007

(54) SERIAL DIODE CELL AND NONVOLATILE MEMORY DEVICE USING THE SAME

(75) Inventor: Hee Bok Kang, Daejeon (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 209 days.

(21) Appl. No.: 10/876,463

(22) Filed: Jun. 28, 2004

(65) Prior Publication Data

US 2005/0135140 A1 Jun. 23, 2005

(30) Foreign Application Priority Data

Dec. 22, 2003 (KR) .................. 10-2003-0094569

(51) Int. Cl.
*G11C 11/22* (2006.01)

(52) U.S. Cl. .................. 365/145; 365/175; 365/117; 365/65; 365/72; 257/46; 257/295

(58) Field of Classification Search ............... 365/145, 365/175, 149, 117, 65, 72; 257/46, 295
See application file for complete search history.

(56) References Cited

U.S. PATENT DOCUMENTS

| | | | |
|---|---|---|---|
| 6,256,220 B1 * | 7/2001 | Kamp | 365/145 |
| 6,272,594 B1 | 8/2001 | Gupta et al. | |
| 6,275,408 B1 * | 8/2001 | Aoki et al. | 365/145 |
| 6,330,178 B1 * | 12/2001 | Sakata et al. | 365/145 |
| 6,344,991 B1 * | 2/2002 | Mikami et al. | 365/145 |
| 6,363,439 B1 | 3/2002 | Battles et al. | |
| 6,707,703 B2 * | 3/2004 | Kawashima | 365/145 |
| 6,845,030 B2 * | 1/2005 | Kang et al. | 365/145 |
| 6,856,573 B2 * | 2/2005 | Allen et al. | 365/230.06 |
| 6,924,997 B2 * | 8/2005 | Chen et al. | 365/145 |
| 6,930,906 B2 * | 8/2005 | Matsushita et al. | 365/145 |
| 6,956,767 B2 * | 10/2005 | Kang | 365/175 |
| 7,009,865 B2 * | 3/2006 | Kang | 365/145 |
| 7,009,866 B2 * | 3/2006 | Kang | 365/145 |
| 2003/0103372 A1 * | 6/2003 | Matsushita | 365/145 |
| 2003/0174532 A1 * | 9/2003 | Matsushita et al. | 365/145 |

(Continued)

FOREIGN PATENT DOCUMENTS

EP 0441584 A2 * 8/1991

(Continued)

*Primary Examiner*—Viet Q. Nguyen
(74) *Attorney, Agent, or Firm*—Heller Ehrman LLP

(57) ABSTRACT

A nonvolatile memory device features a serial diode cell as a cross-point cell using a nonvolatile ferroelectric capacitor and a serial diode chain. The serial diode cell comprises a ferroelectric capacitor and a serial diode switch. The ferroelectric capacitor, located where a word line and a bit line are crossed, stores values of logic data. The serial diode switch is connected between the ferroelectric capacitor and the bit line and selectively switched depending on voltages applied to the word line. The nonvolatile memory device using a serial diode cell comprises a plurality of serial diode cell arrays, a plurality of word line driving units and a plurality of sense amplifiers. Each of the plurality of serial diode cell arrays each includes a single serial diode cell where a word line and a bit line are crossed. The plurality of word line driving units selectively drive the word line. The plurality of sense amplifiers sense and amplify data transmitted through the bit line.

19 Claims, 15 Drawing Sheets

U.S. PATENT DOCUMENTS

2005/0152174 A1* 7/2005 Kang .................. 365/145
2005/0169036 A1* 8/2005 Kang .................. 365/145
2005/0174839 A1* 8/2005 Kang .................. 365/175
2005/0254283 A1* 11/2005 Kang .................. 365/145

FOREIGN PATENT DOCUMENTS

| | | | |
|---|---|---|---|
| JP | 405342850 A | * | 12/1993 |
| JP | 2000323669 | * | 11/2000 |
| JP | 02000323669 A | * | 11/2000 |
| JP | 02003272376 A | * | 9/2003 |
| JP | 2004265984 A | * | 9/2004 |
| KR | 2001-0057275 A | | 3/2003 |

* cited by examiner

SERIAL DIODE CELL AND NONVOLATILE MEMORY DEVICE USING THE SAME

BACKGROUND OF THE INVENTION

1. Field of the Invention

The present invention generally relates to a memory device, and more specifically to a phase change resistor cell comprising a cross-point cell using a phase change resistor and a serial diode switch, a nonvolatile memory device using the phase change resistor cell to reduce the chip size.

2. Description of the Prior Art

Generally, a ferroelectric random access memory (hereinafter, referred to as 'FeRAM') has attracted considerable attention as next generation memory device because it has a data processing speed as fast as a Dynamic Random Access Memory DRAM and conserves data even after the power is turned off.

The FeRAM having structures similar to the DRAM includes the capacitors made of a ferroelectric substance, so that it utilizes the characteristic of a high residual polarization of the ferroelectric substance in which data is not deleted even after an electric field is eliminated.

The technical contents on the above FeRAM are disclosed in the Korean Patent Application No. 2001-57275 by the same inventor of the present invention. Therefore, the basic structure and the operation on the FeRAM are not described herein.

The conventional FeRAM comprises a switching device which is switched depending on a voltage of a word line and connects a nonvolatile ferroelectric capacitor to a sub bit line. The nonvolatile ferroelectric capacitor is connected to a terminal of the switching device and a plate line.

Meanwhile, the conventional FeRAM comprises a switch device and a memory device for storing data. Here, the switching device of the conventional memory device is a NMOS transistor whose switching operation is controlled by a gate control signal.

However, the above-described NMOS transistor requires an additional area for gate control when a cell array is embodied with a switching device, which results in increase of the whole chip size.

SUMMARY OF THE INVENTION

Accordingly, it is a first object of the present invention to embody a phase change resistor cell comprising a serial diode switch using a Silicon On Insulator (hereinafter, referred to as "SOI") wafer.

It is a second object of the present invention to reduce the whole size of a nonvolatile memory device by embodying a cross-point cell using a PCR and a serial diode switch.

It is a third object of the present invention to improve operation characteristics of a memory cell by effectively driving read/write operations in a cell array using the PCR and the serial diode switch.

In an embodiment, a serial diode cell comprises a ferroelectric capacitor and a serial diode switch. The ferroelectric capacitor, located where a word line and a bit line are crossed, stores values of logic data. The serial diode switch is connected between the ferroelectric capacitor and the bit line and selectively switched depending on voltages applied to the word line.

Preferably, the serial diode switch comprises a silicon layer where a P-type region and a N-type region are alternately formed on an insulating layer, the bit line and the ferroelectric capacitor are formed on the upper portion of the serial diode switch, a contact node connected to the ferroelectric capacitor is connected to a predetermined location of the serial diode switch, and the serial diode switch is divided into a PN diode switch and a PNPN diode switch on a basis of the contact node.

In an embodiment, a nonvolatile memory device using a serial diode cell comprises a plurality of serial diode cell arrays, a plurality of word line driving units and a plurality of sense amplifiers. Each of the plurality of serial diode cell arrays each includes a single serial diode cell where a word line and a bit line are crossed. The plurality of word line driving units selectively drive the word line. The plurality of sense amplifiers sense and amplify data transmitted through the bit line. The nonvolatile memory device further comprises a data bus, a main amplifier, a data buffer and an input/output port. The data bus is shared by the plurality of sense amplifiers. The main amplifier amplifies data of the data bus. The data buffer buffers data inputted/outputted in the main amplifier. The input/output port, connected to the data buffer, inputs/outputs data.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
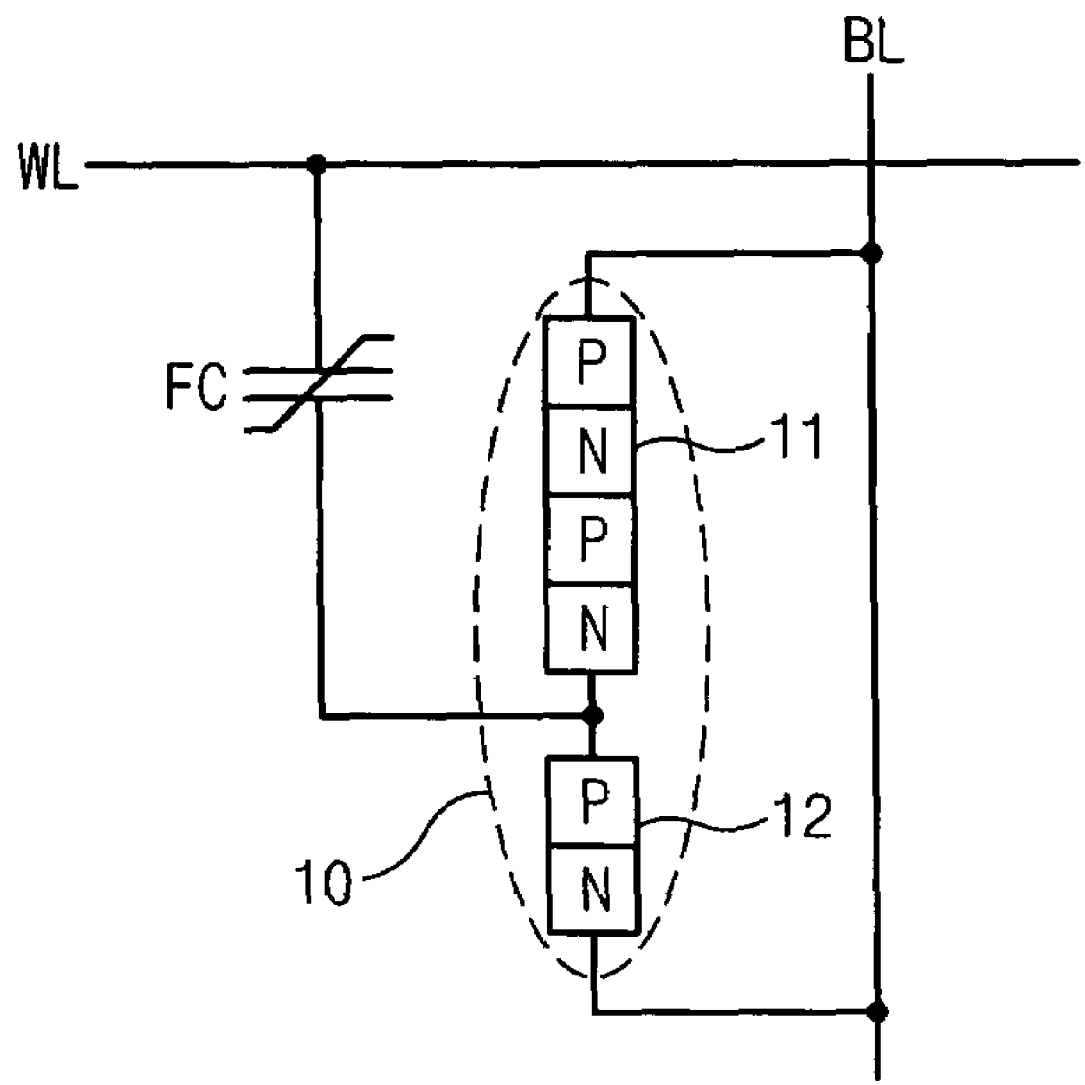
FIG. 1 is a circuit diagram of a serial diode cell according to an embodiment of the present invention.

FIG. 1 is a circuit diagram of a serial diode cell according to an embodiment of the present invention.

In an embodiment, the serial diode cell comprises a nonvolatile ferroelectric capacitor FC and a serial diode switch 10. Here, the serial diode switch 10 comprises a PNPN diode switch 11 and a PN diode switch 12. The PNPN diode switch 11 and the PN diode switch 12 are connected in parallel between the nonvolatile ferroelectric capacitor FC and a bit line BL.

The PNPN diode switch 11 is connected in a reverse direction between the nonvolatile ferroelectric capacitor FC and the bit line BL. The PN diode switch 12 is connected in a forward direction between the nonvolatile ferroelectric capacitor FC and the bit line BL. The nonvolatile ferroelectric capacitor FC is connected to a word line WL.

Figure 2:
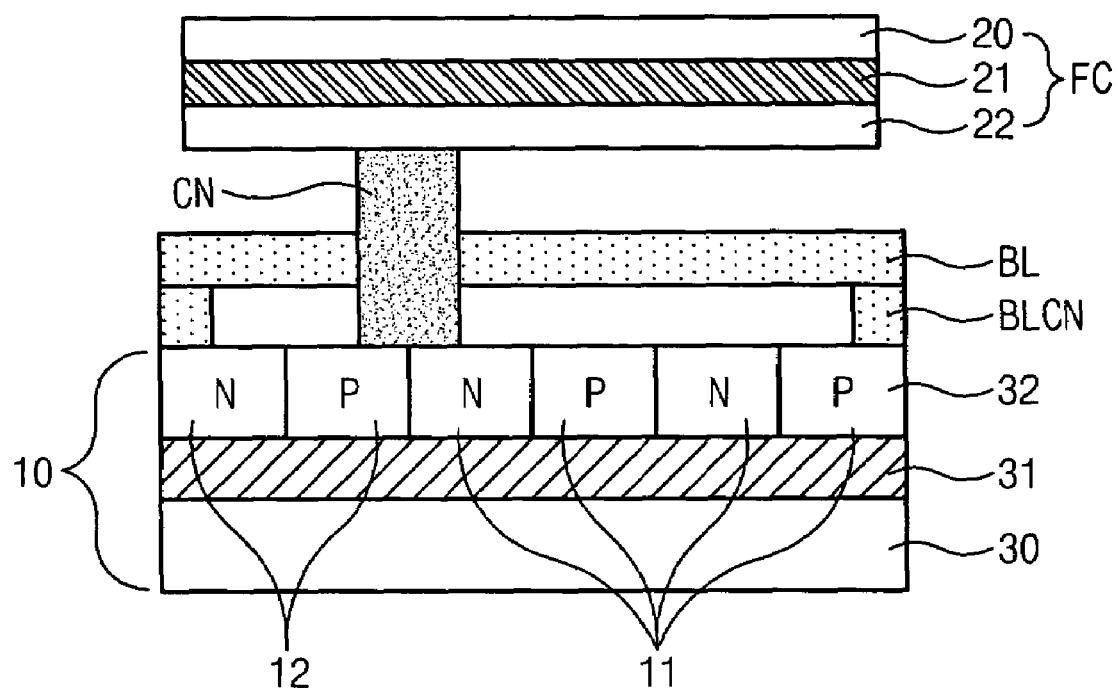
FIG. 2 is a cross-sectional diagram of the serial diode cell of FIG. 1.

FIG. 2 is a cross-sectional diagram of the serial diode cell of FIG. 1.

An insulating layer 31 is formed on a silicon substrate 30, and a silicon layer 32 is formed on the insulating layer 31. A region doped with P-type impurities and a region doped with N-type impurities are alternately formed in the silicon layer 32 which is the serial diode switch 10. Here, the insulating layer 31 is formed of $SiO_2$, and the silicon layer 32 is formed of epitaxial silicon or deposition polysilicon. The serial diode switch 10 comprises a serially connected diode chain comprising the PNPN diode switch 11 and the PN diode switch 12.

The silicon layer 32 comprises a plurality of rows, and a single row separated by the insulating layer 31 comprises a diode chain comprising a PNPN diode switch 11 and a PN diode switch 12 which are connected serially.

In the PNPN diode switch 11, the P-type region and the N-type region are alternately arranged in the same layer, and the pair of the P-type region and the N-type region is connected serially. The PN diode switch 12 adjacent to the PNPN diode switch 11 comprises a plurality of the P-type region and the N-type region which are connected serially.

A bit line contact node BLCN is formed on the top portion of the N-type region and the P-type region located at both end portions of the diode chain which comprises the PNPN diode switch 11 and the PN diode switch 12. The upper portion of the node BLCN is connected to the bit line BL. A common contact node CN is formed on the top portion of the P-type region and the N-type region where the PN diode switch 12 and the PNPN diode switch 11 are contacted, and a bottom electrode 22 of the PCR is connected through the common contact node CN to the top portion of the P-type region and the N-type region.

Here, the nonvolatile ferroelectric capacitor FC comprises a top electrode 20, a ferroelectric layer 21 and a bottom electrode 22. The top electrode 20 of the nonvolatile ferroelectric capacitor FC is connected to the word line WL.

Figure 4:
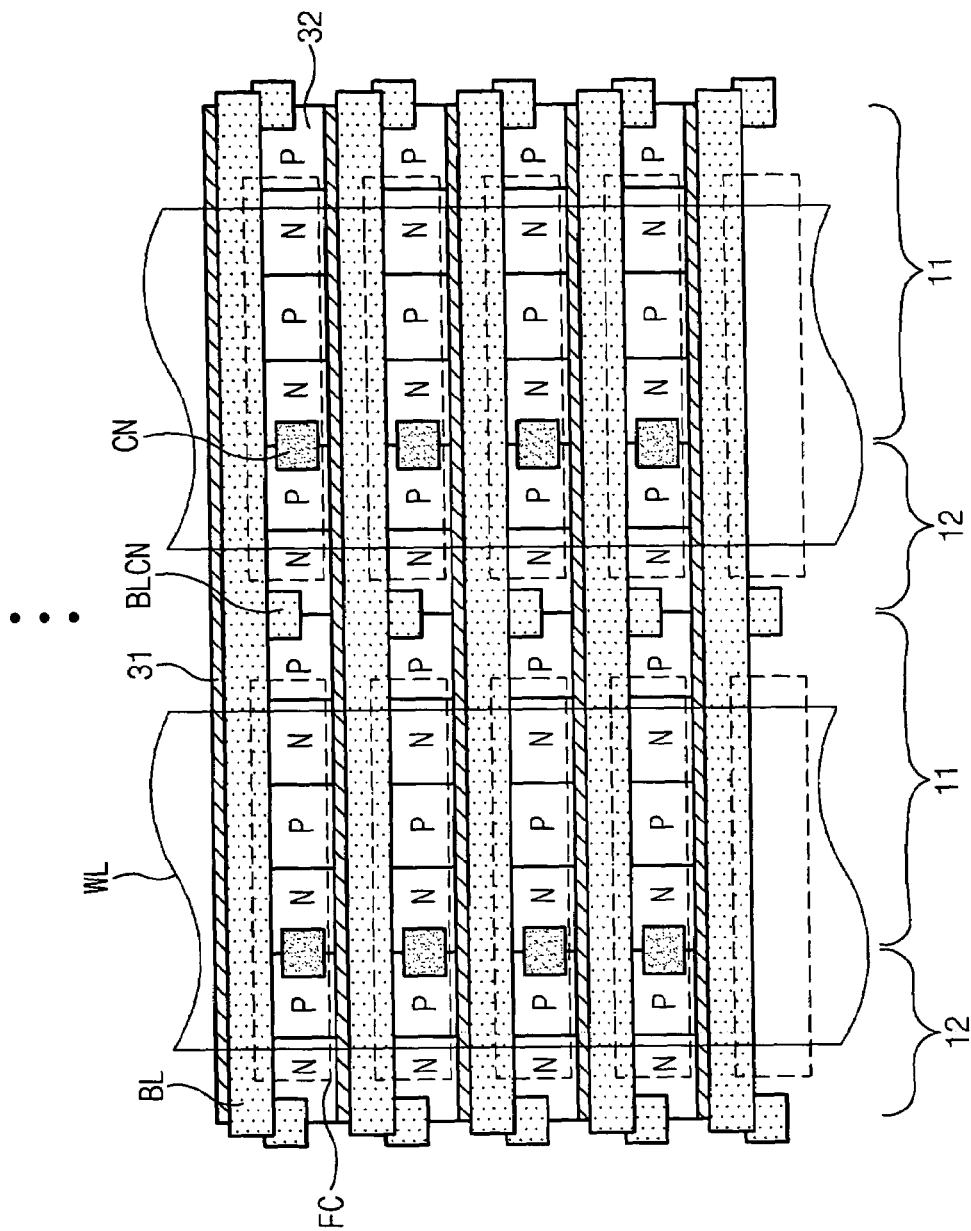
FIG. 4 is a layout diagram of the serial diode cell of FIG. 1.

FIG. 2 is a diagram illustrating a cross-section corresponding to a portion II—II of FIG. 4. Here, the bit line BL is illustrated for convenience of explanation although the bit line BL is not shown in the actual cross section.

Figure 3:
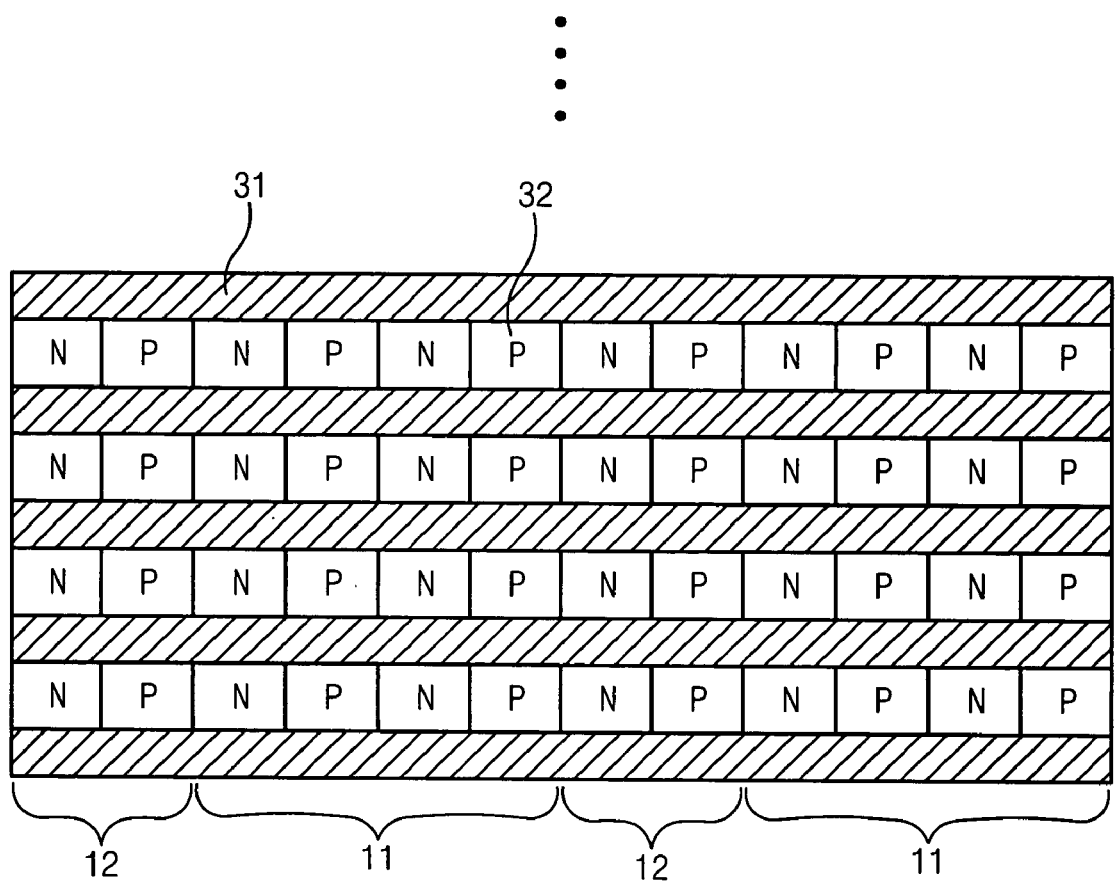
FIG. 3 is a layout diagram of a serial diode switch of FIG. 1.

FIG. 3 is a layout diagram of the serial diode switch 10 of FIG. 1.

The serial diode switch 10 comprises a plurality of serial chains of the PNPN diode switch 11 and the PN diode switch 12 included in the silicon layer 32 as shown in FIG. 4. A plurality of the serial diode switches 10 are formed on the insulating layer 31 in parallel. The serial diode switch 10 is formed to have the SOI structure, and each serial diode switch 10 is separated by the insulating layer 31.

FIG. 4 is a layout diagram of the serial diode cell of FIG. 1.

The PNPN diode switch 11 and the PN diode switch 12 which are connected serially are formed in the silicon layer 32 consisting of epitaxial silicon or polysilicon, and the top and the bottom of each serial diode switch 10 are insulated by the insulating layer 31. The contact node CN is formed between the PN region and the PNPN region of the serial diode switch 10. The contact node CN is contacted in common with the P-type region adjacent to the N-type region. The nonvolatile ferroelectric capacitor FC is formed on the contact node CN.

The N-type region and the P-type region of both end portions of the serial diode switch 10 connected through the bit line contact node BLCN to the bit line BL. The bit line contact node BLCN is connected in common to the bit line contact node BLCN of the adjacent serial diode cell. The contact node BLCN connected to the same bit line may be shared with the serial diode switch 10 of the adjacent cell.

The word line WL is formed on the nonvolatile ferroelectric capacitor FC.

Figure 5:
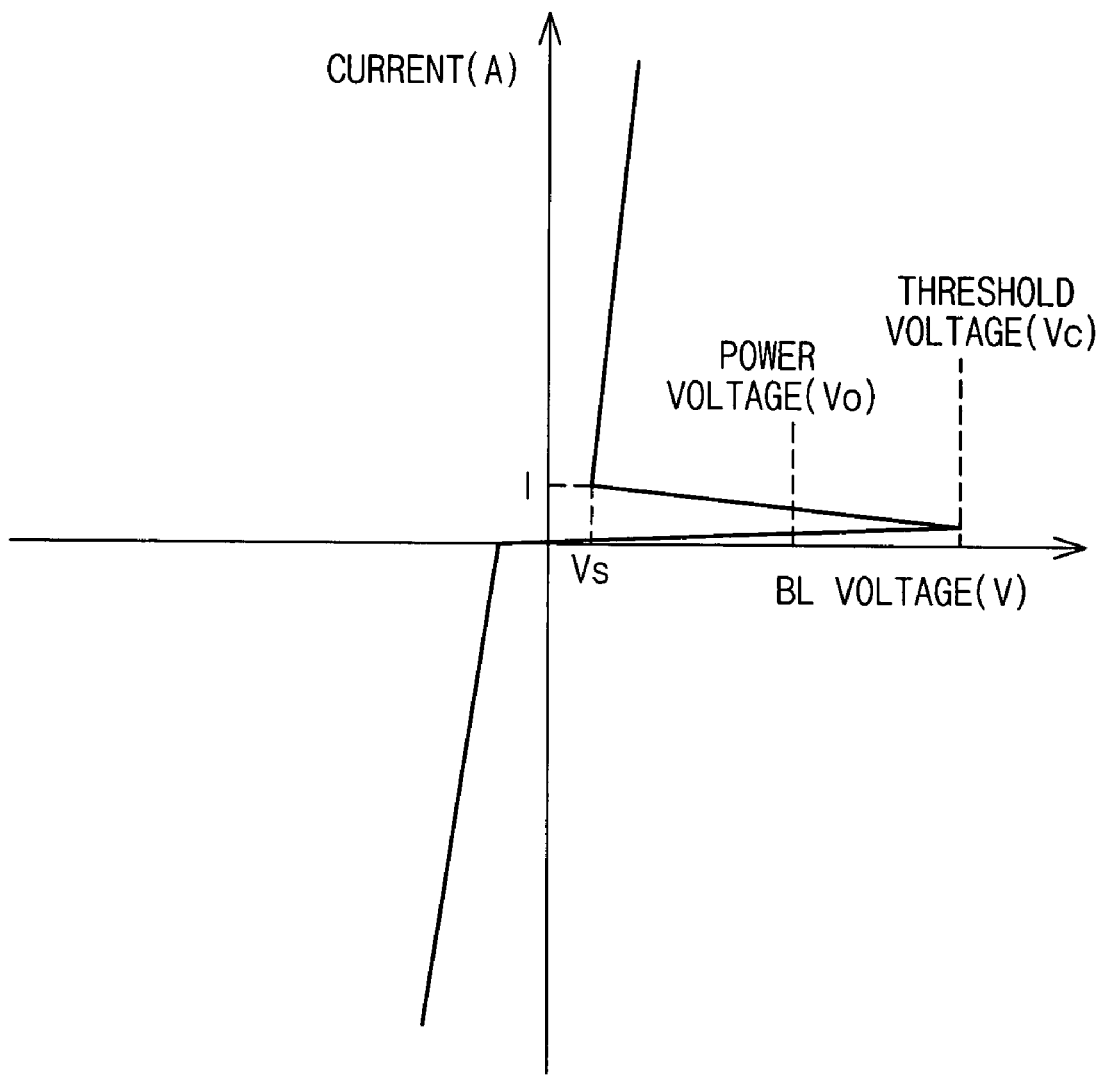
FIG. 5 is a graph illustrating the operation of the serial diode switch of FIG. 1.

FIG. 5 is a graph illustrating the operation of the serial diode switch 10 of FIG. 1.

Although a voltage applied to the nonvolatile ferroelectric capacitor FC increases in a positive direction on a basis of the bit line BL and reaches a voltage Vo, the serial diode switch 10 is kept off by operation characteristics of the PNPN diode switch 11. As a result, current does not flow in the nonvolatile ferroelectric capacitor FC.

Thereafter, if a voltage applied to the bit line BL more increases and reaches a threshold voltage Vc, the PNPN diode switch 11 is turned on by the forward operation characteristic of the diode. As a result, the serial diode switch 10 is turned on, and the amount of current dramatically increases. Here, when the voltage applied to the bit line BL is over the threshold voltage Vc, a value of current I connected to the bit line BL is affected by resistance (not shown) connected to the PCR to serve as load.

After the PNPN diode switch 11 is turned on, the large amount of current can flow although a small voltage Vs is applied to the PCR. Here, the PN diode switch 10 is kept off by the reverse operation characteristic.

On the other hand, if a predetermined voltage is applied to the word line WL and the voltage applied to the nonvolatile ferroelectric capacitor FC increases toward a negative direction on the basis of the bit line BL, the serial diode switch 10 is turned on by the forward operation characteristic of the PN diode switch 10. Then, current flows at a random operation voltage state. Here, the PNPN diode switch 11 is kept by the reverse operation characteristic.

Figure 6A:
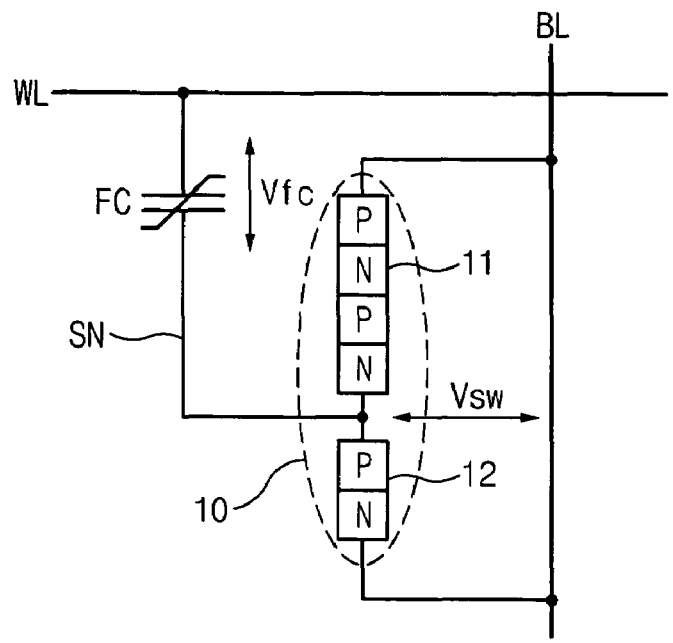
FIGS. 6a to 6c are a circuit diagram and graphs illustrating the word line/bit line voltage dependency of the serial diode cell according to an embodiment of the present invention.
Figure 6B:
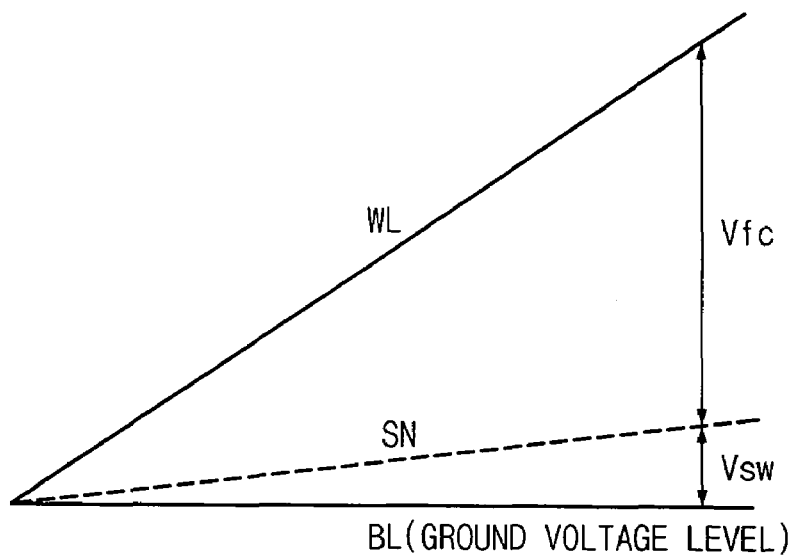
Figure 6C:
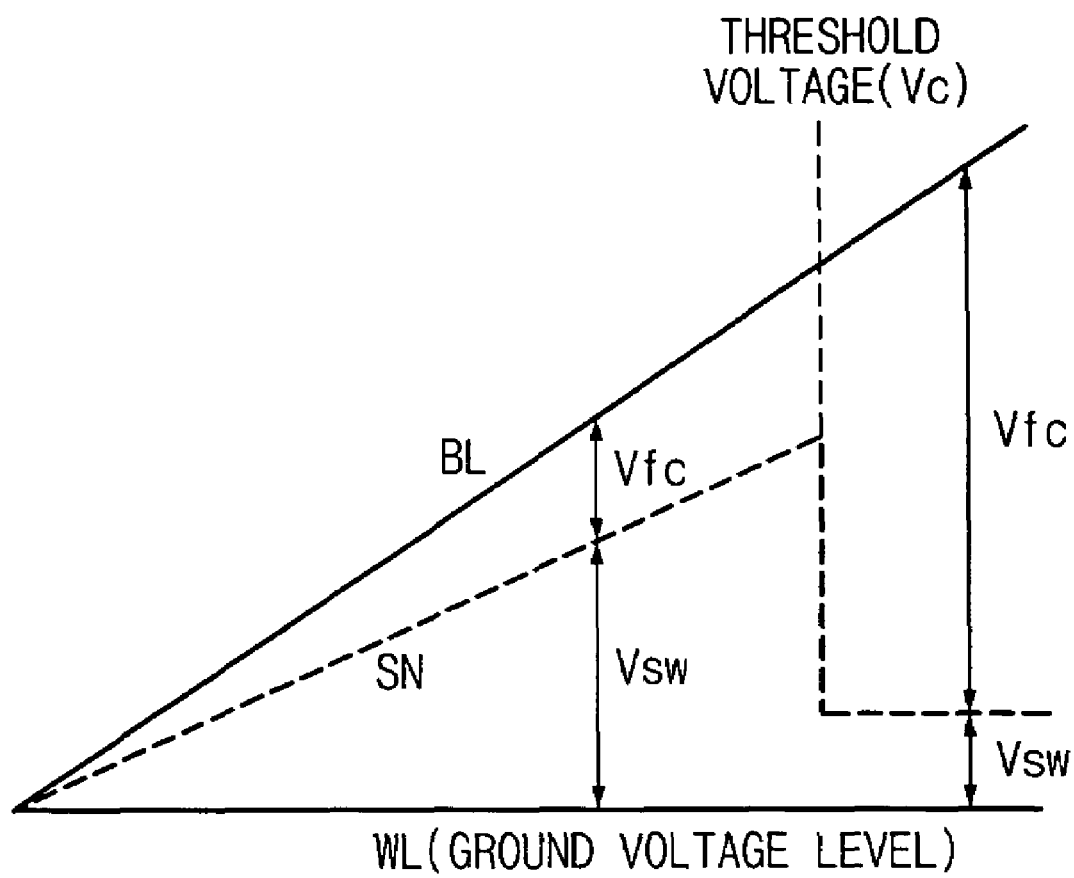

FIGS. 6a to 6c are a circuit diagram and graphs illustrating the word line WL/bit line BL voltage dependency of the serial diode cell according to an embodiment of the present invention.

Referring to FIG. 6a, Vfc refers to a voltage flowing in the nonvolatile ferroelectric capacitor FC connected between the word line WL and a node SN, and Vsw refers to a voltage flowing in the serial diode switch 10 connected between the node SN and the bit line BL.

FIG. 6b is a diagram illustrating the word line WL voltage dependency of the serial diode cell according to an embodiment of the present invention.

If a voltage of the word line WL increases while a voltage of the bit line BL is fixed at a ground voltage level, the voltage of the word line WL is distributed to the nonvolatile ferroelectric capacitor FC and the serial diode switch 10.

In other words, if the voltage of the word line WL increases while the voltage of the bit line BL is at the ground level, the PN diode switch 12 of the serial diode switch 10 is turned on at a small voltage. As a result, current flows.

Here, the small voltage Vsw is distributed by the forward operation characteristic of the PN diode switch in the serial diode switch 10. On the other hand, the voltage of the word line WL is distributed as the large voltage Vfc to the nonvolatile ferroelectric capacitor FC. Therefore, the operation characteristics of the serial diode cell are improved.

FIG. 6c is a diagram illustrating the bit line BL voltage dependency of the serial diode cell according to an embodiment of the present invention.

If a voltage of the bit line BL increases while a voltage of the word line WL is fixed at a ground voltage level, the voltage of the bit line BL is distributed to the nonvolatile ferroelectric capacitor FC and the serial diode switch 10.

In other words, if the voltage of the bit line BL increases while the voltage of the word line WL is fixed at the ground voltage level, the PNPN diode switch 11 of the serial diode switch 10 is kept off until the voltage of the bit line BL reaches a threshold voltage Vc. The PN diode switch 12 of the serial diode switch 10 is kept off by the reverse operation characteristic. As a result, most voltage of the bit line BL is distributed as the large voltage Vsw to the serial diode switch 10.

On the other hand, when the serial diode switch 10 is turned off, the voltage of the bit line BL is distributed as the small voltage Vfc to the nonvolatile ferroelectric capacitor FC. As a result, data stored in the nonvolatile ferroelectric capacitor FC are not changed.

Thereafter, when the voltage of the bit line BL rises to reach over the threshold voltage Vc, the PNPN diode switch 11 of the serial diode switch 10 is turned on, and most voltage of the bit line BL is distributed to the nonvolatile ferroelectric capacitor FC, and the voltage Vfc increases. As a result, new data are written in the nonvolatile ferroelectric capacitor FC of the serial diode cell.

Figure 7:
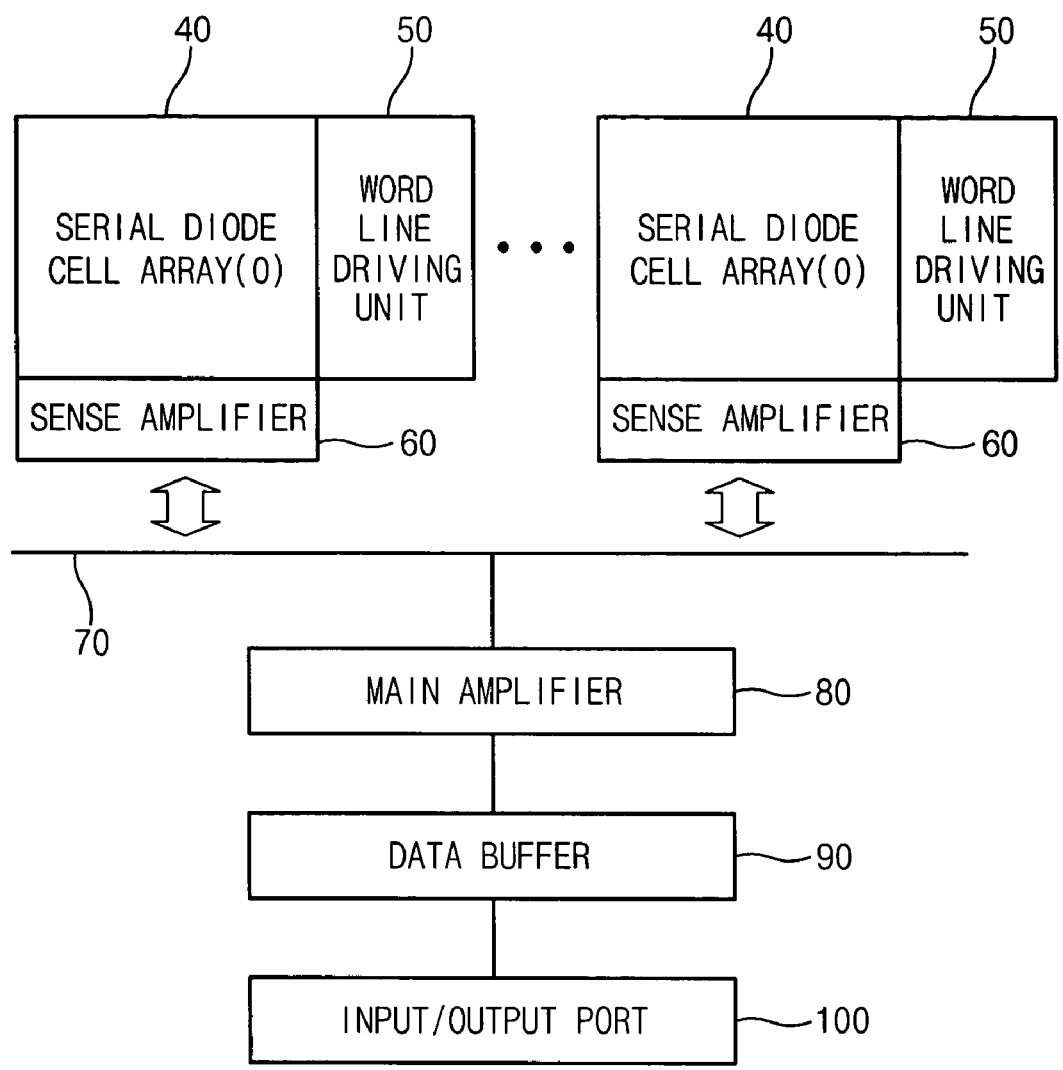
FIG. 7 is a block diagram of a nonvolatile memory device using a serial diode cell according to an embodiment of the present invention.

FIG. 7 is a block diagram of a nonvolatile memory device using a serial diode cell according to an embodiment of the present invention.

In an embodiment, the nonvolatile memory device comprises a plurality of serial diode cell arrays 40, a plurality of word line driving units 50, a plurality of sense amplifiers 60, a data bus 70, a main amplifier 80, a data buffer 90 and an input/output port 100.

Each serial diode cell array 40 comprises a plurality of serial diode cells arranged in row and column directions as described in FIG. 1. A plurality of word lines WL arranged in the row direction are connected to the word line driving unit 50. A plurality of bit lines BL arranged in the column direction are connected to the sense amplifier 60.

Here, one serial diode cell array 40 is correspondingly connected to one word line driving unit 50 and one sense amplifier 60.

The plurality of sense amplifiers 60 share one data bus 70. The data bus 70 is connected to the main amplifier 80 which amplifies data applied from each sense amplifier 60 through the data bus 70.

The data buffer 90 buffers the amplified data applied from the main amplifier 80. The input/output port 100 outputs output data applied from the data buffer 90 to the outside or applies input data applied from the outside to the data buffer 90.

Figure 8:
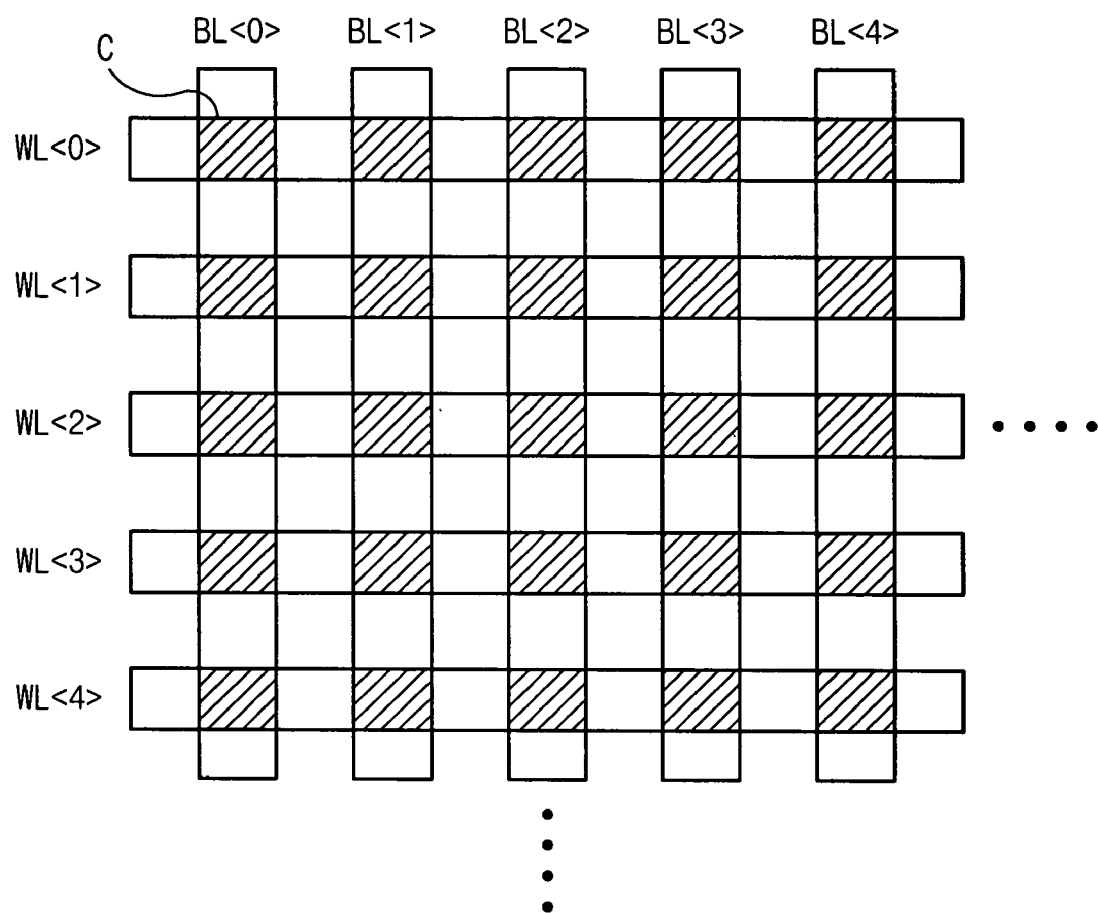
FIG. 8 is a layout diagram of a cross-point cell of FIG. 7.

FIG. 8 is a layout diagram of the serial diode cell array 40 of FIG. 7.

The serial diode cell array 40 comprises a plurality of word lines WL arranged in the row direction and a plurality of bit lines BL arranged in the column direction. A unit cell C is located only where the word line WL and the bit line BL are crossed. That is, a cross-point cell is embodied. Since it is unnecessary to form devices in other regions, a cell can be formed in a space necessary to form the word line WL and the bit line BL without requiring an additional area.

Here, the cross-point cell refers to a serial diode cell using the serial diode switch 10 comprising a nonvolatile ferroelectric capacitor FC located where a bit line BL and a word line WL are crossed. The serial diode switch 10 does not comprise a NMOS transistor using an additional word line WL or gate control signal but comprises two connection electrode node.

Figure 9:
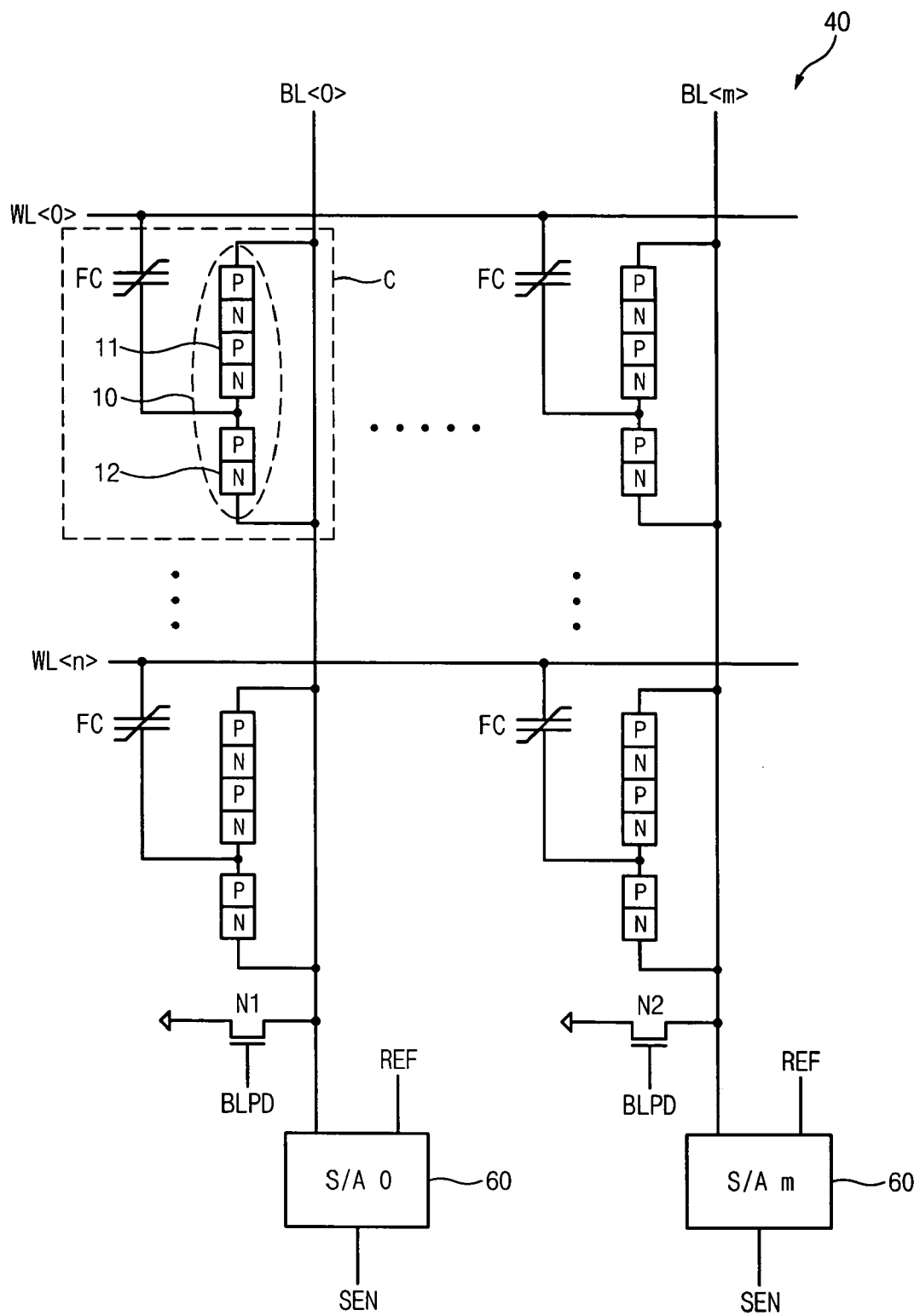
FIG. 9 is a circuit diagram of a serial diode cell array of FIG. 7.

FIG. 9 is a circuit diagram of the serial diode cell array 40 of FIG. 7.

The serial diode cell array 40 comprises a plurality of word lines WL<0>~WL<n> arranged in the row direction and a plurality of bit lines BL<0>~BL<m> arranged in the column direction. A unit cell C is located only where the word line WL and the bit line BL are crossed. Here, the unit cell C comprises one nonvolatile ferroelectric capacitor FC and one serial diode switch 10.

The plurality of sense amplifiers 60 are connected one by one to the bit lines BL. Each sense amplifier 60 compares a voltage applied from the bit line BL with a reference voltage REF previously set when a sense amplifier enable signal SEN is activated, and amplifies the comparison result.

A bit line pull-down device N1 is connected to the bit line BL<0>, and a bit line pull-down device N2 is connected to the bit line BL<m>. When a bit line pull-down signal BLPD is activated, the bit line pull-down devices N1 and N2 apply a ground voltage to the bit line BL and pull down the bit line BL to a ground level.

The above-described serial diode cell array 40 is operated so that each nonvolatile ferroelectric capacitor FC may store one data.

Figure 10:
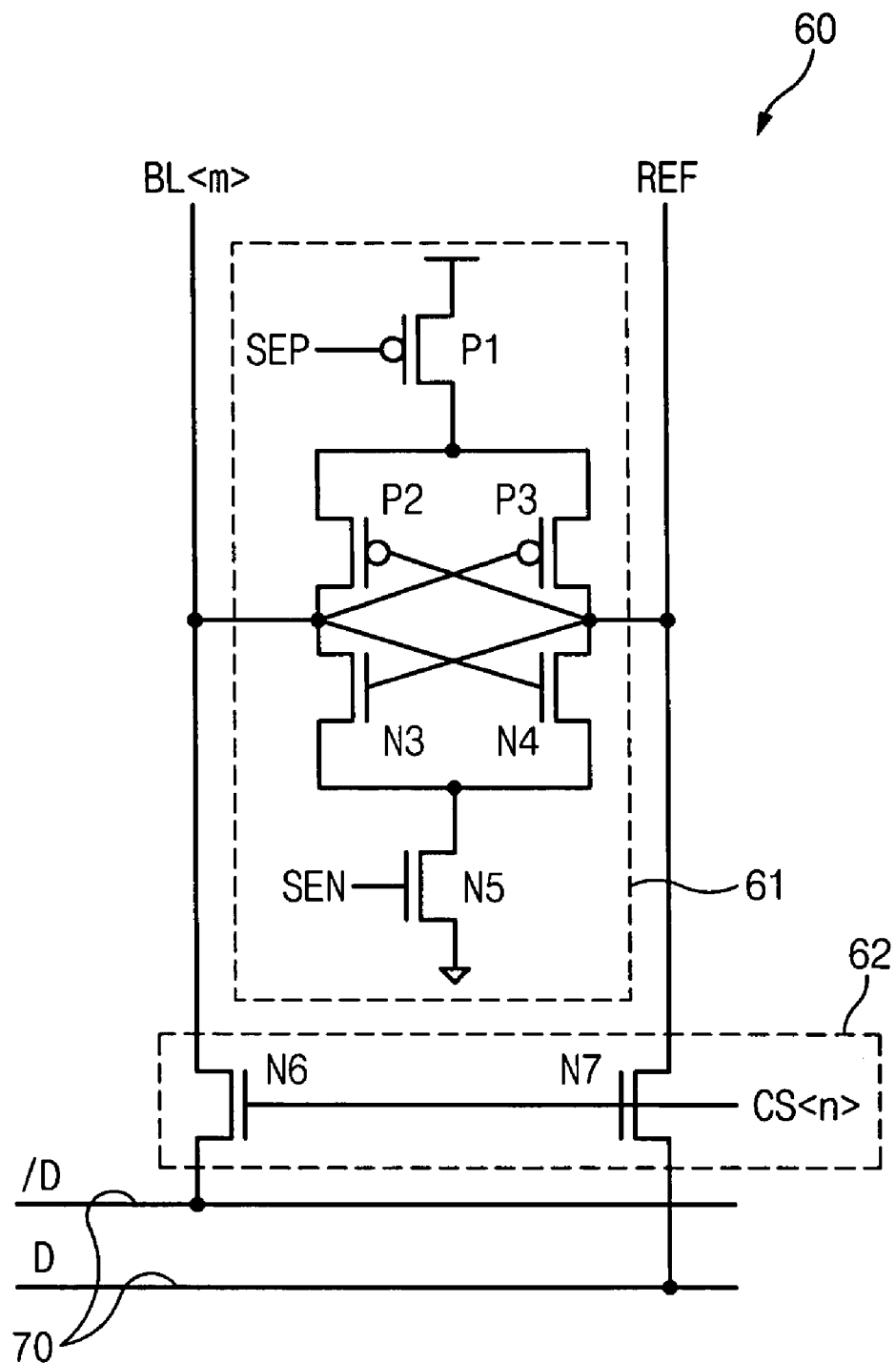
FIG. 10 is a circuit diagram of a sense amplifier of FIG. 9.

FIG. 10 is a circuit diagram of the sense amplifier 60 of FIG. 9.

The sense amplifier 60 comprises an amplifying unit 61 and a column selecting switching unit 62.

Here, the amplification unit 61 comprises PMOS transistors P1~P3 and NMOS transistors N1~N3. The PMOS transistor P1, connected between a power voltage terminal and a common source terminal of the PMOS transistors P2 and P3, has a gate to receive a sense amplifier enable signal SEP. The cross-coupled PMOS transistors P2 and P3 latch a power voltage applied through the PMOS transistor P1.

A NMOS transistor N5, connected between a ground voltage terminal and a common source terminal of NMOS transistors N3 and N4, has a gate to receive a sense amplifier enable signal SEN. The cross-coupled NMOS transistors N3 and N4 latch a ground voltage applied through the NMOS transistor N5.

Here, the sense amplifier enable signal SEN has a phase opposite to that of the sense amplifier enable signal SEP. When the sense amplifier enable signal SEN is activated, the amplification unit 61 is operated. One output terminal of the amplification unit 61 is connected to the bit line BL<m>, and the other output terminal of the amplification unit 61 is connected to a terminal to receive a reference voltage REF.

The column selecting switching unit 62 comprises NMOS transistors N6 and N7. The NMOS transistor N6, connected between the bit line BL<m> and the data bus 70, has a gate to receive a column selecting signal CS<n>, thereby controlling input/output of the data /D. The NMOS transistor N7, connected to the terminal to receive the reference voltage REF and the data bus 70, has a gate to receive the column selecting signal CS<n>, thereby controlling input/output of the data D.

Figure 11:
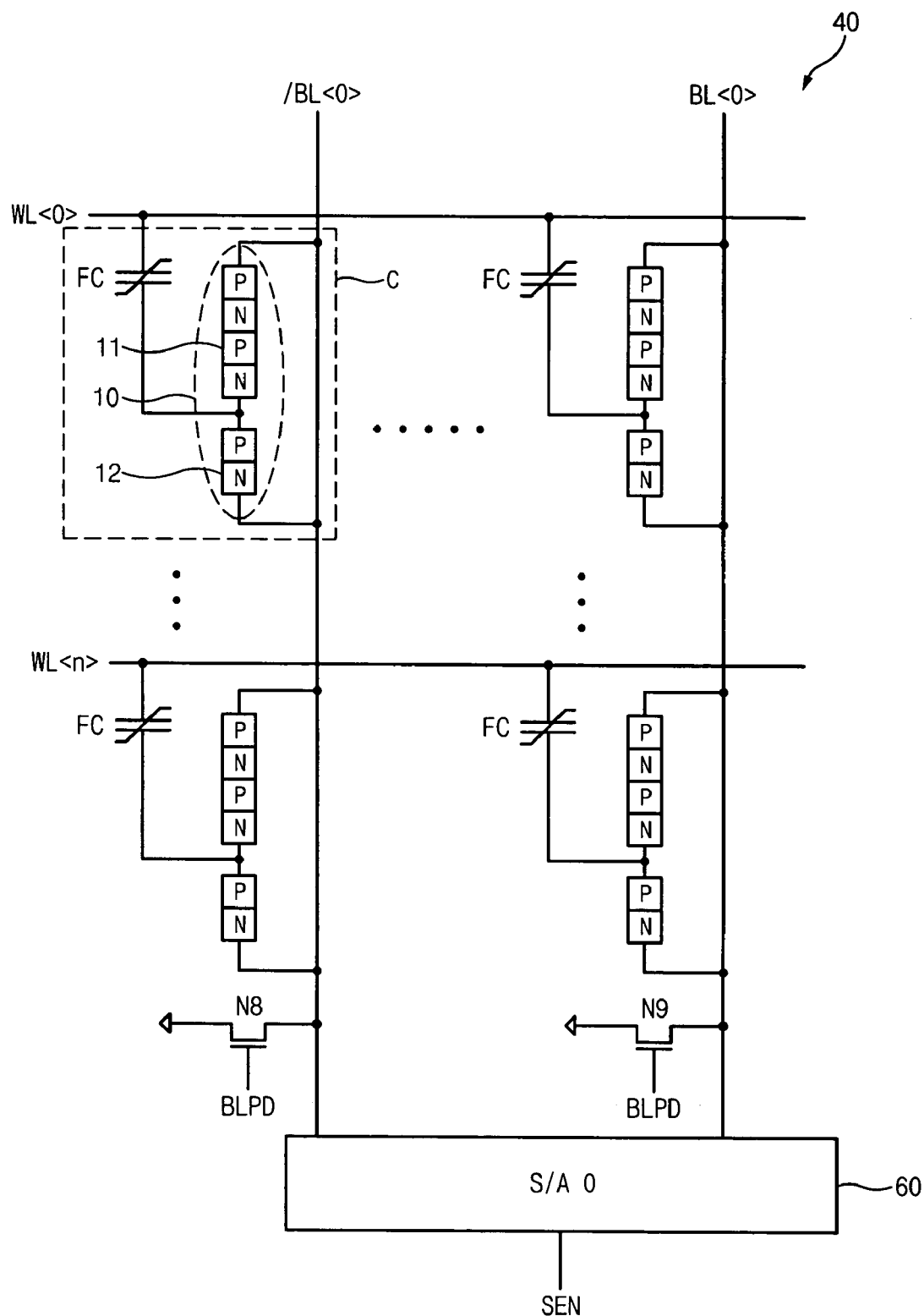
FIG. 11 is a circuit diagram illustrating another example of the serial diode cell array of FIG. 7.

FIG. 11 is a circuit diagram illustrating another example of the serial diode cell array of FIG. 7.

The serial diode cell array 40 comprises a plurality of word lines WL<0>~WL<n> arranged in the row direction and a plurality of paired bit lines BL and /BL arranged in the column direction. A unit cell C is located only where the paired bit lines BL and /BL are crossed. The unit cell C comprises one nonvolatile ferroelectric capacitor FC and one serial diode switch 10.

One sense amplifier 60 is connected one by one to the paired bit lines BL and /BL. When a sense amplifier enable signal SEN is activated, each sense amplifier 60 is simultaneously operated to amplify data applied from the paired bit lines BL and /BL.

A bit line pull-down device N8 is connected to the bit line /BL<0>, and a bit line pull-down device N9 is connected to the bit line BL<0>. As a result, when a bit line pull-down signal BLPD is activated, the bit line pull-down devices N3 and N4 apply a ground voltage to the paired bit lines BL and /BL, and pull down the paired bit lines BL and /BL to a ground voltage level.

The above-described serial diode cell array 40 is operated so that two nonvolatile ferroelectric capacitors FC may store one data.

Figure 12:
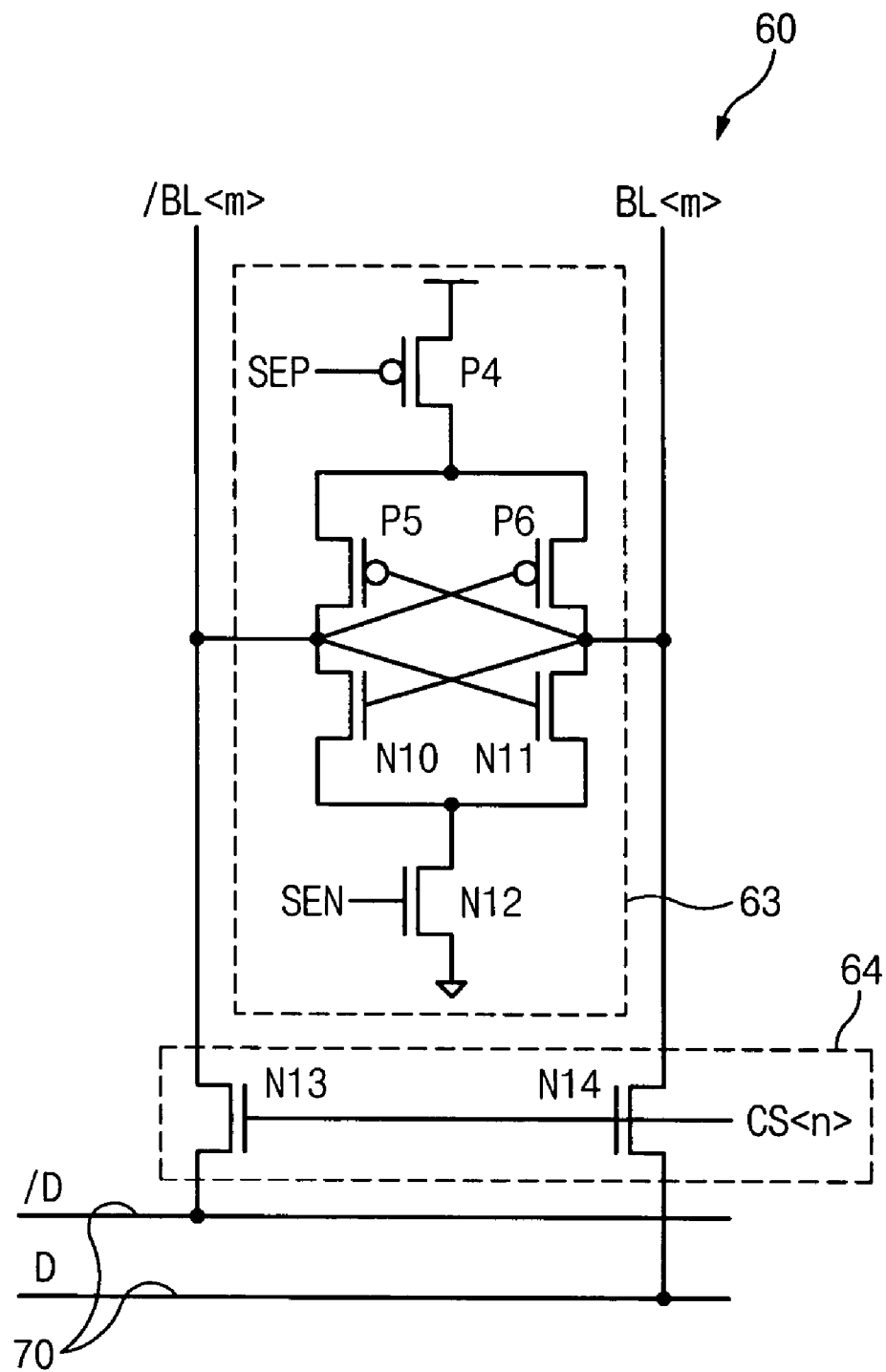
FIG. 12 is a circuit diagram of the sense amplifier of FIG. 11.

FIG. 12 is a circuit diagram of the sense amplifier 60 of FIG. 11.

The sense amplifier 60 comprises an amplifying unit 63 and a column selecting switching unit 64.

Here, the amplification unit 63 comprises PMOS transistors P4~P6 and NMOS transistors N10~N12. The PMOS transistor P4, connected between a power voltage terminal and a common source terminal of the PMOS transistors P5 and P6, has a gate to receive a sense amplifier enable signal SEP. The cross-coupled PMOS transistors P5 and P6 latch a power voltage applied through the PMOS transistor P4.

A NMOS transistor N12, connected between a ground voltage terminal and a common source terminal of NMOS transistors N10 and N11, has a gate to receive a sense amplifier enable signal SEN. The cross-coupled NMOS transistors N10 and N11 latch a ground voltage applied through the NMOS transistor N12.

Here, the sense amplifier enable signal SEN has a phase opposite to that of the sense amplifier enable signal SEP. When the sense amplifier enable signal SEN is activated, the amplification unit 63 is operated. One output terminal of the amplification unit 63 is connected to the bit line BL<m>, and the other output terminal of the amplification unit 63 is connected to a terminal to receive a reference voltage REF.

The column selecting switching unit 64 comprises NMOS transistors N13 and N14. The NMOS transistor N13, connected between the bit line BL<m> and the data bus 70, has a gate to receive a column selecting signal CS<n>, thereby controlling input/output of the data /D. The NMOS transistor N14, connected to the terminal to receive the reference voltage REF and the data bus 70, has a gate to receive the column selecting signal CS<n>, thereby controlling input/output of the data D.

Figure 13:
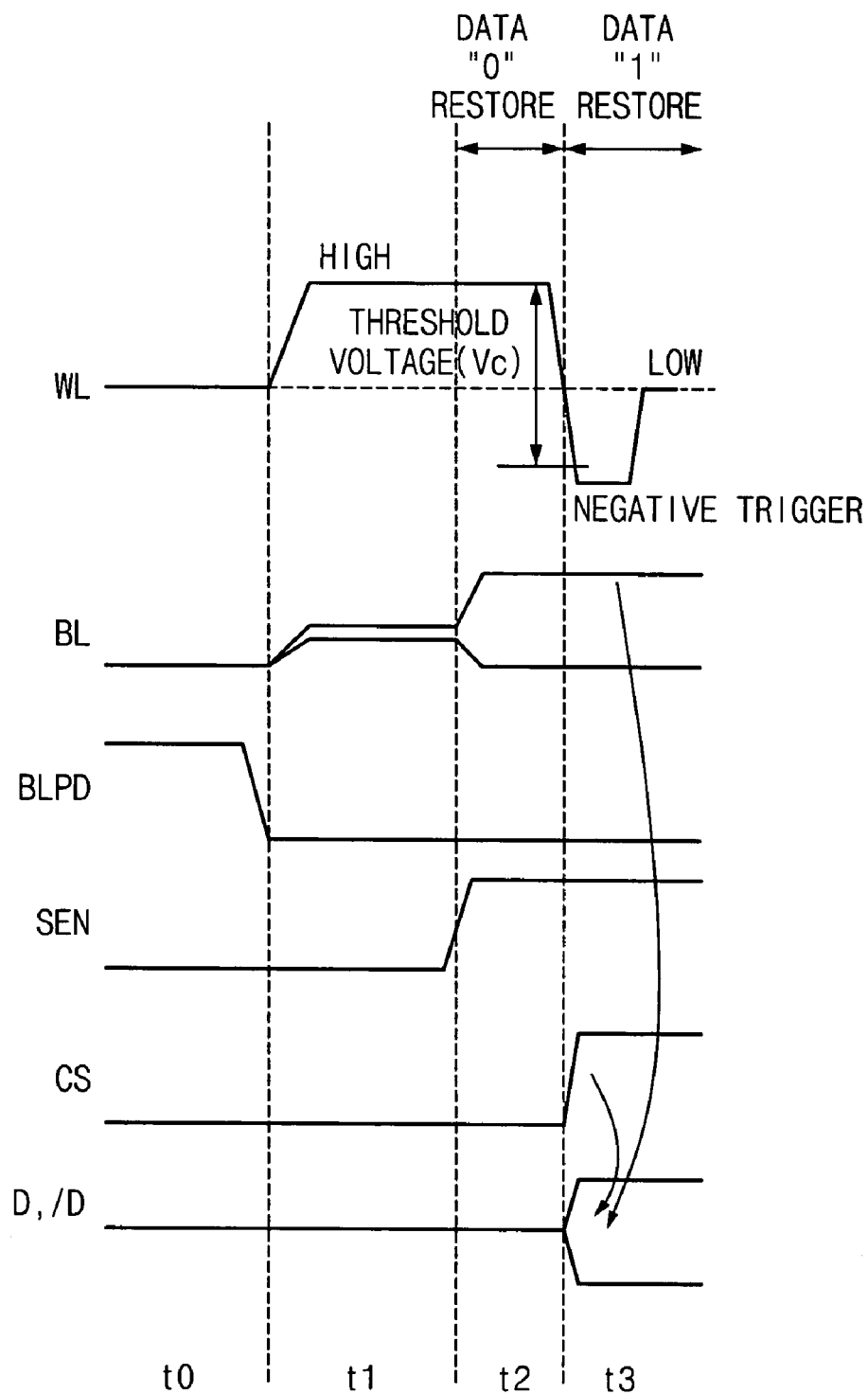
FIG. 13 is a timing diagram illustrating the read mode of the nonvolatile memory device using a serial diode cell according to an embodiment of the present invention.

FIG. 13 is a timing diagram illustrating the read mode of the nonvolatile memory device using a serial diode cell according to an embodiment of the present invention.

In an interval t0, the bit line pull-down signal BLPD is activated, and the ground voltage is applied to the paired bit lines BL. As a result, the bit line BL is precharged to the ground level.

When an interval t1 starts, if the word line WL transits to 'high' and a predetermined voltage is applied to the word line WL, the PN diode 12 of the serial diode switch 10 is turned on. As a result, data of the serial diode cell are transmitted to the bit line BL. Here, the bit line pull-down signal BLPD transits to 'low'.

Next, in an interval t2, if the sense amplifier enable signal transits to 'high', the sense amplifier 60 amplifies data applied from the bit line BL. If the voltage of the bit line BL is amplified to the low level while the voltage of the word line WL is 'high', data "0" is restored in the serial diode cell C.

Thereafter, in an interval t3, the voltage of the word line WL transits to a negative voltage which is less than the threshold voltage Vc. That is, a difference between the low voltage level of the bit line BL and the negative voltage level of the word line WL does not reach the level of the threshold voltage Vc to turn on the PNPN diode switch 11 of the serial diode switch 10.

However, a voltage higher than the threshold voltage Vc is applied to turn on the PNPN diode switch 11 depending on the difference between the low voltage level of the bit line BL and the negative voltage level of the word line WL. As a result, the PNPN diode switch 11 is turned on, and data "1" are restored in the serial diode cell.

After the PNPN diode switch 11 is turned on, a large amount of current can flow although the small voltage Vs is applied to the bit line BL. As a result, the sufficient amount of current can flow although the voltage of the word line WL rises from the negative voltage to the low level in the interval t3.

In the interval t3, if the column selecting signal transits to 'high', the NMOS transistors N6 and N7 of the column selecting switching unit 62 are turned on, and the data D and /D in the bit line BL are outputted to the data bus 70. As a result, data stored in the serial diode cell C can be read.

Figure 14:
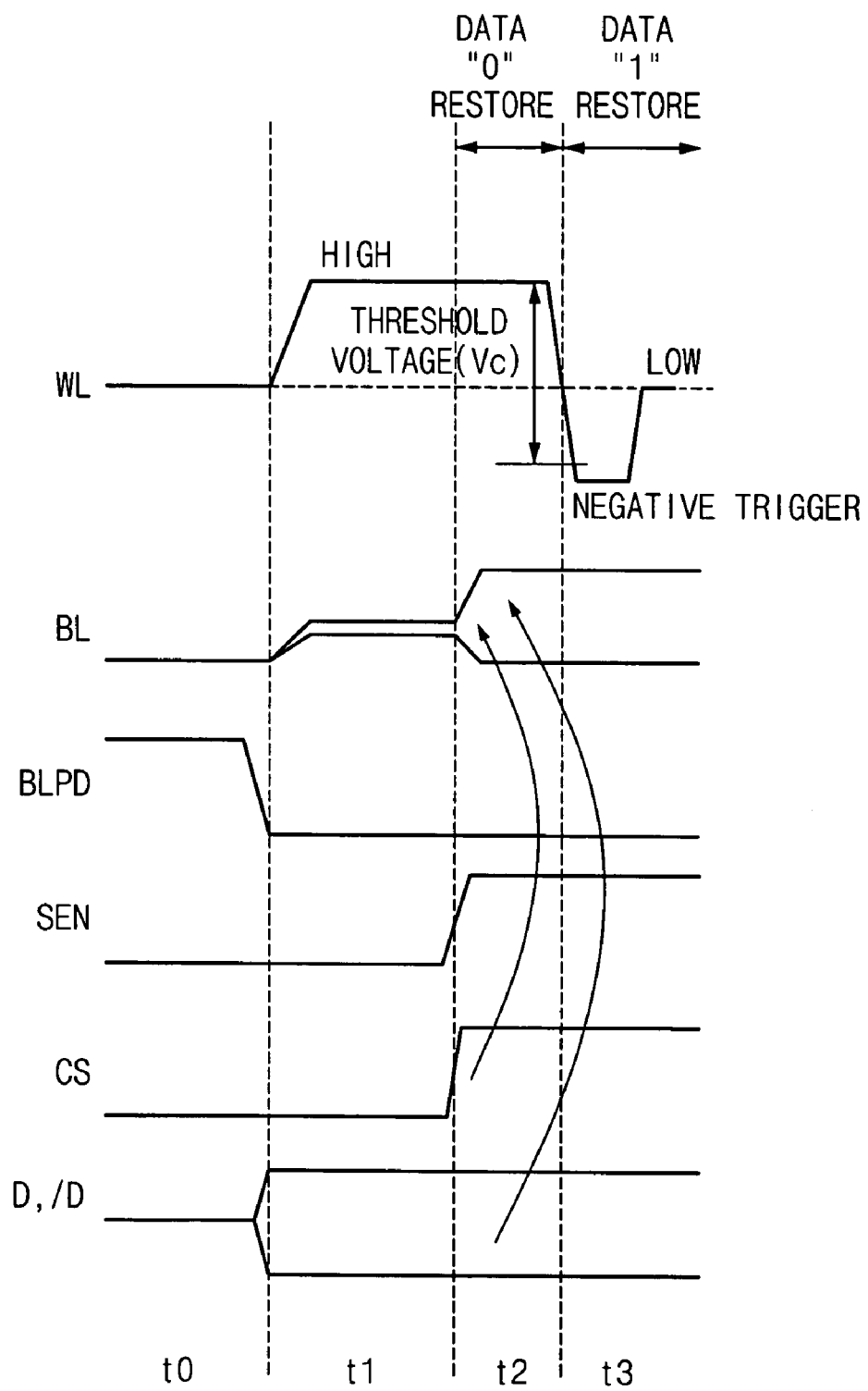
FIG. 14 is a timing diagram illustrating the write mode of the nonvolatile memory device using a serial diode cell according to an embodiment of the present invention.

FIG. 14 is a timing diagram illustrating the write mode of the nonvolatile memory device using a serial diode cell according to an embodiment of the present invention.

In an interval t0, the bit line pull-down signal BLPD is activated, and the ground voltage is applied to the paired bit lines BL. As a result, the bit line BL is pulled down to the ground level.

Thereafter, when an interval t1 starts, if the voltage of the word line WL transits to 'high', data of the serial diode cell are transmitted to the bit line BL. Here, the bit line pull-down signal BLPD transits to 'low'. Then, new data D and /D to be written through the data bus 70 are inputted to the bit line BL.

Next, in an interval t2, the sense amplifier enable signal SEN is activated, and the sense amplifier 60 amplifies data in the bit line BL. If the voltage of the bit line BL is amplified to the low level while the voltage of the word line is 'high', data "0" are written in the serial diode cell C.

Here, if the column selecting signal CS transits to 'high', the NMOS transistors N6 and N7 of the column selecting switching unit 62 are turned on. As a result, the data D and /D inputted through the data bus 70 are applied to the bit line BL.

Thereafter, in an interval t3, the voltage of the word line WL transits to the negative voltage. That is, a difference between the low voltage level of the bit line BL and the negative voltage level of the word line WL does not read the level of the threshold voltage Vc to turn on the PNPN diode switch 11 of the serial diode switch 10.

However, a voltage higher than the threshold voltage Vc to turn on the PNPN diode switch 11 is applied depending on the high level voltage of the bit line BL and the negative voltage level of the word line WL. As a result, the PNPN diode switch 11 is turned on, and data "1" are written in the serial diode cell.

Although a nonvolatile ferroelectric memory device is described as an example of a memory device to store data herein, the present invention is not limited to the particular form disclosed. Rather, the memory device according to an embodiment of the present invention can include a DRAM device or a flash device.

As discussed earlier, a nonvolatile memory device using a phase change resistor cell according to an embodiment of the present invention provides the following effects: to embody a phase change resistor cell comprising a serial diode switch using a SOI wafer; to reduce the whole size of a nonvolatile memory device by embodying a cross-point cell using a PCR and a serial diode switch; and to improve operation characteristics of a memory cell by effectively driving read/write operations in a cell array using the PCR and the serial diode switch.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A serial diode cell comprising:
   a ferroelectric capacitor, located where a word line and a bit line are crossed, for storing values of logic data; and
   a serial diode switch connected between the ferroelectric capacitor and the bit line and selectively switched depending on voltages applied to the word line;
   wherein the serial diode switch comprises:
   a first switching unit for reading data of the ferroelectric capacitor when a first voltage having over a predetermined level is applied to the word line; and
   a second switching unit for writing data in the ferroelectric capacitor when a second voltage higher than the first voltage is applied to the bit line.

2. The serial diode cell according to claim 1, wherein the serial diode switch comprises a silicon layer where a P-type region and a N-type region are alternately formed on an insulating layer,
   the bit line and the ferroelectric capacitor are formed on the upper portion of the serial diode switch,
   a contact node connected to the ferroelectric capacitor is connected to a predetermined location of the serial diode switch, and
   the serial diode switch is divided into a first switching unit and a second switching unit on a basis of the contact node.

3. The serial diode cell according to claim 1, wherein the first switching unit comprises at least one or more pairs of a P-type region and a N-type region, and
   the second switching unit is configured to have more pairs of the P-type region and the N-type region than the first switching unit.

4. The serial diode cell according to claim 3, wherein the first switching unit comprises a PN diode switch, and the second switching unit comprises a PNPN diode switch.

5. The serial diode cell according to claim 4, wherein the PN diode switch is connected in a forward direction and the PNPN diode switch is connected in a reverse direction.

6. The serial diode cell according to claim 4, wherein the serial diode switch reads cell data of the ferroelectric capacitor to the bit line when a high level voltage is applied to the word line to turn on the PN diode switch, and
   the serial diode switch writes data of the bit line to the ferroelectric capacitor when a negative trigger voltage is applied to the word line to turn on the PNPN diode switch.

7. The serial diode cell according to claim 6, wherein after the negative trigger voltage is applied, a voltage level of the bit line drops step by step when data of the bit line are at a high level, and a voltage level of the bit line is constantly maintained when data of the bit line are at a low level.

8. A nonvolatile memory device using a serial diode cell, comprising:
   a plurality of serial diode cell arrays each including a single serial diode cell where a word line and a bit line are crossed;
   a plurality of word line driving units for selectively driving the word line; and
   a plurality of sense amplifiers for sensing and amplifying data transmitted through the bit line,
   wherein the single serial diode cell comprises:
   a ferroelectric capacitor, located where a word line and a bit line are crossed, for storing values of logic data; and
   a serial diode switch connected between the ferroelectric capacitor and the bit line and selectively switched depending on voltages applied to the word line;
   wherein the serial diode switch comprises:
   a first switching unit for reading data of the ferroelectric capacitor when a first voltage having over a predetermined level is applied to the word line; and
   a second switching unit for writing data in the ferroelectric capacitor when a second voltage higher than the first voltage is applied to the bit line.

9. The nonvolatile memory device according to claim 1, wherein the serial diode switch comprises a silicon layer where a P-type region and a N-type region are alternately formed on an insulating layer,
   the bit line and the ferroelectric capacitor are formed on the upper portion of the serial diode switch,
   a contact node connected to the ferroelectric capacitor is connected to a predetermined location of the serial diode switch, and
   the serial diode switch is divided into a first switching unit and a second switching unit on a basis of the contact node.

10. The nonvolatile memory device according to claim 8, wherein the first switching unit comprises at least one or more pairs of a P-type region and a N-type region, and
    the second switching unit is configured to have more pairs of the P-type region and the N-type region than the first switching unit.

11. The nonvolatile memory device according to claim 10, wherein the first switching unit comprises a PN diode switch, and the second switching unit comprises a PNPN diode switch.

12. The nonvolatile memory device according to claim 11, wherein the PN diode switch is connected in a forward direction and the PNPN diode switch is connected in a reverse direction.

13. The nonvolatile memory device according to claim 11, wherein the serial diode switch reads cell data of the ferroelectric capacitor to the bit line when a high level voltage is applied to the word line to turn on the PN diode switch, and the serial diode switch writes data of the bit line to the ferroelectric capacitor when a negative trigger voltage is applied to the word line to turn on the PNPN diode switch.

14. The nonvolatile memory device according to claim 13, wherein after the negative trigger voltage is applied, a voltage level of the bit line drops step by step when data of the bit line are at a high level, and a voltage level of the bit line is constantly maintained when data of the bit line are at a low level.

15. The nonvolatile memory device according to claim 8, further comprising:
 a data bus shared by the plurality of sense amplifiers;
 a main amplifier for amplifying data of the data bus;
 a data buffer for buffering data inputted/outputted in the main amplifier; and
 an input/output port, connected to the data buffer, and for inputting/outputting data.

16. The nonvolatile memory device according to claim 8, wherein each of the plurality of serial diode cell arrays further comprises a plurality of bit line pull-down devices connected one by one to the plurality of the bit lines.

17. The nonvolatile memory device according to claim 8, wherein the plurality of sense amplifiers, connected one by one to the plurality of bit lines, compare and amplify voltages of the bit lines with reference voltages when a sense amplifier enable signal is activated.

18. The nonvolatile memory device according to claim 8, wherein each of the plurality of serial diode cell arrays comprises a pair of a bit line and a bit line bar, and bit line pull-down devices corresponding to the bit line and the bit line bar, respectively.

19. The nonvolatile memory device according to claim 18, wherein each of the plurality of sense amplifiers is configured to correspond to the pair of the bit lines, and to amplify a voltage applied from the pair of the bit lines.

* * * * *